United States Patent [19]
Carter

[11] Patent Number: 4,777,562
[45] Date of Patent: Oct. 11, 1988

[54] WIRE WRAP SINGLE IN-LINE PACKAGE

[76] Inventor: Jeffrey K. Carter, 307 Cory Lane, Middletown, R.I.

[21] Appl. No.: 70,756

[22] Filed: Jul. 6, 1987

[51] Int. Cl.$^4$ ............................................. H05K 7/00
[52] U.S. Cl. .............................. 361/395; 174/52 PE; 361/405
[58] Field of Search ...................... 174/52 PE, 52 FP; 357/72, 75, 80; 361/392, 395, 399, 400, 404–406

[56] References Cited

U.S. PATENT DOCUMENTS

| | | | |
|---|---|---|---|
| 3,501,582 | 3/1970 | Heidler et al. | 361/399 |
| 3,699,394 | 10/1972 | Schuler | 361/395 |
| 3,748,538 | 7/1973 | Sheaeyian et al. | 174/52 TE |
| 4,603,374 | 7/1986 | Wasielewski | 361/395 |

Primary Examiner—Philip H. Leung
Assistant Examiner—Gregory D. Thompson
Attorney, Agent, or Firm—Michael J. McGowan; Arthur A. McGill; Prithvi C. Lall

[57] ABSTRACT

A thick film passive network on an alumina substrate, the passive elements being terminated by conducting metal leads. The network, substrate and a small portion of each lead is encapsulated in a material with high insulation characteristics. The geometry of the leads and overall package alignment characterizes the device as a wire wrap SIP, use of which provides the capability of high board density and closer board-to-board spacing.

4 Claims, 1 Drawing Sheet

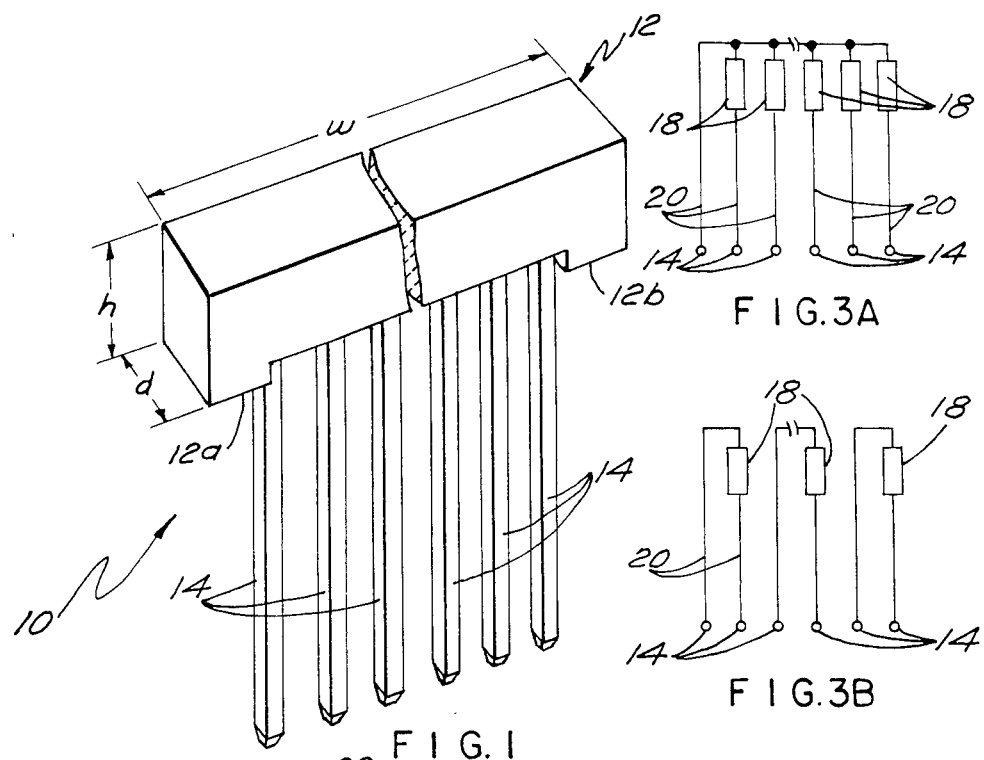
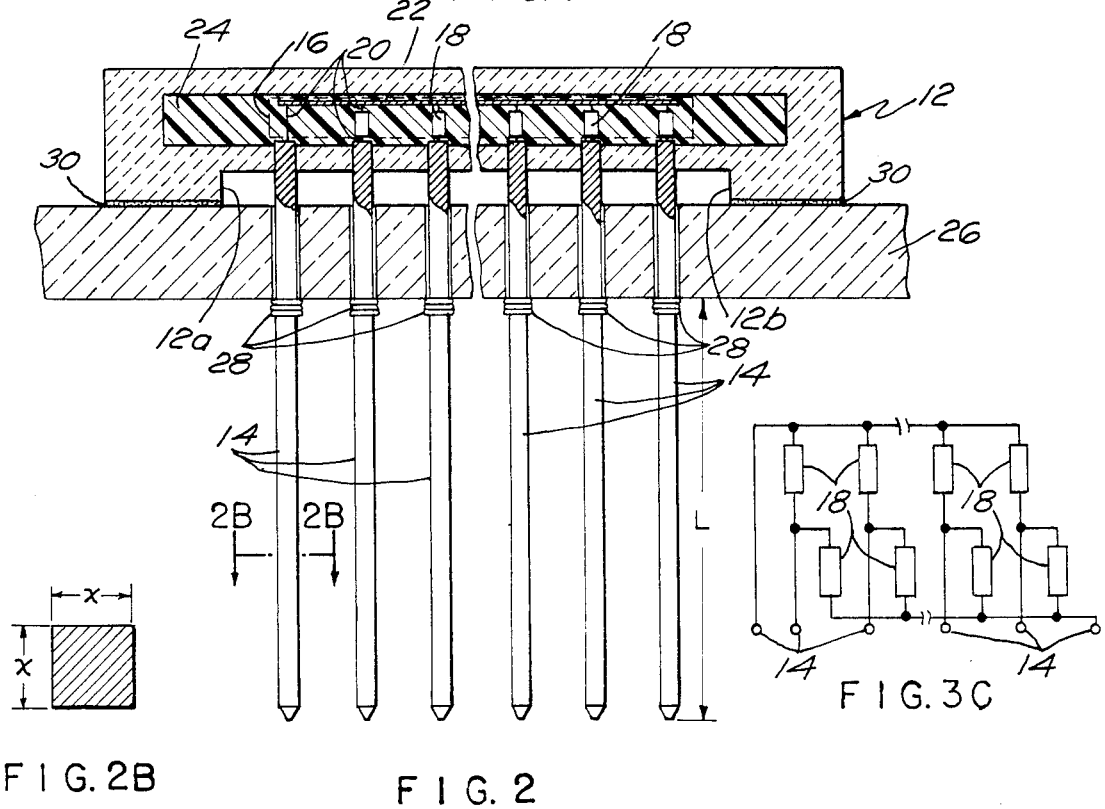

WIRE WRAP SINGLE IN-LINE PACKAGE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

The present invention relates to electrical flat packs and more particularly to a passive, single in-line package (SIP) device having wire wrap leads.

(2) Description of the Prior Art

It is well known that wire wrap circuit boards presently implement passive networks such as resistor circuits through use of dual in-line package (DIP) modules or bench fabricated resistor headers. The disadvantage of using such DIP packages is that DIP sockets, either soldered or wire wrapped, must then also be provided. Where a plurality of passive networks are required for a particular application, considerable circuit board area is consumed thereby reducing area available for conventional integrated circuits (ICs). In addition, the sockets add to the overall height of the circuits above the circuit board, affecting board-to-board spacing the overall system configuration. Printed circuit (PC) board SIPs also exist which are used for memory or IC installation. Further, there are also IC DIPs presently used with wire wrap DIP sockets that are functionally equivalent to SIPs, but their physical features tend to have the same space wasting drawbacks. What is needed is a narrow, low profile passive circuit implementation for use with wire wrap and printed circuit boards.

SUMMARY OF THE INVENTION

Accordingly, it is a general purpose and object of the resent invention to provide a single in-line package (SIP) having wire wrap type leads. It is a further object that the SIP device present a low profile when mounted on a PC board. Another object is that the SIP device utilize passive electronic component networks which are embedded therein. Still another object is that these passive circuits be formed of thick film networks on alumina substrates.

These objects are accomplished with the present invention by providing a thick film passive element network on an alumina substrate, the passive elements being terminated by conducting metal leads. The network, substrate and a small portion of each lead is encapsulated in a material with high insulation characteristics. The geometry of the leads and overall package characterizes the device as a wire wrap SIP, use of which provides the capability of high board density.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein:

FIG. 1 shows an isometric view of a SIP device according to the present invention.

FIG. 2 shows a detail cross section of a typical configuration of the device of FIG. 1.

FIG. 2B shows a cross-sectional view of a typical wire wrap lead of FIG. 2 taken along line 2B—2B thereof.

FIGS. 3A through 3C show typical passive element network arrangements for the device of FIG. 1.

DESCRIPTION OF THE PREFERRED EMBODIMENT

Referring now to FIG. 1 there is shown a wire wrap SIP 10 according to the present invention. SIP 10 further comprises a rectangular ceramic block 12 of width "w", height "h", depth "d", a rectangular internal cavity formed therein with an opening to the rear not shown in FIG. 1, a longitudinal axis, and having downwardly extending pads 12a and 12b integrally formed at each end thereof. A plurality of uniformly spaced, square apertures, aligned with the longitudinal axis of block 12, pass from the bottom of block 12 up into the internal cavity. A plurality of uniformly spaced square metal leads 14, one each corresponding in shape and size to each of the plurality of apertures, extend downward from block 12 a preselected length "L". Leads 14 are disposed orthogonally with respect to the longitudinal axis of block 12 and aligned along such axis while passing through and fixedly attaching to apertures. Each lead 14 has a generally square cross section with sharp corners of the type used for wire wrapping once they have been extended through holes in a wire wrap board or a PC board.

FIG. 2 shows a cross section of SIP 10 of FIG. 1. Internally, SIP 10 comprises a thick film passive element network shown generally as 16 where the plurality of passive elements 18 are terminated onto conducting metal or alloy leads 20. Passive electrical elements 18 are well known and may be resistors, capacitors, inductors or the like, or combinations thereof as desired. Network 16 is placed or formed on a substrate 22 of alumina shown schematically as a metal strip in FIG. 2. Network 16, substrate 22 and a small portion of each lead 20 is then encapsulated in a preselected material 24 having high insulation characteristics such as an epoxy or the like. Leads 20 are electrically connected to leads 14 prior to encapsulation. Leads 14 are also "tinned" in order that wire-wrap SIP 10 can be used in printed circuit board type applications.

Each lead 14 has the general shape and uniform spacing shown in FIG. 2B. FIG. 2B shows that each lead 14 is square with dimensions "x" comparable to existing wire wrap type pins and allowing for wrapping wire 28 to cut into the lead corners. Lead 14 length, as compared to the overall SIP height, i.e., combined body and lead length, is comparable to existing wire wrap lead lengths. The ends of each lead 14 are tapered to allow for easy insertion in wire wrap or PC card through holes. All leads have the same center spacing with respect to one another, the spacing being selected to be comparable with existing industry SIP standards.

Pads 12a and 12b are adhesive bonded 30 to board 26 in order to help hold SIP 10 to wire wrap type boards. When installed in PC boards the soldered pins provide adequate holding strength. Pads 12a and 12b are spaced a sufficient distance from the two outer leads 14 to ensure easy application of adhesive and to allow for easy handling of the SIP. Height "h", width "w" and depth "d" in FIG. 1 are selected depending on the internal configuration of the SIP, i.e., the type of SIP, resistive, capacitive or inductive, the number of leads 14, and the number of elements per network. The parallel network 16 of FIG. 2 is merely exemplary and may be varied for use in the overall application. A few other typical network configurations are presented by way of example in FIGS. 3A through 3C without limitation.

The operation of a particular SIP 10 passive circuit depends upon the intended application. Present socketed SIPs are used for pull-up or pull-down arrays, transmission line terminators, current limiting resistors, or ECL terminating networks. Wire wrap SIPs perform these same type of functions, but in a low profile package.

Advantages of wire wrap SIPs include: use of considerably less board space than wire wrap DIPs which comprise a DIP inserted in a wire wrap socket; lower cost than a DIP and a wire wrap socket; commensurately less installation time for wire wrap SIPs vice DIPs because there is no socket to wire wrap, only the SIP leads; and use of wire wrap SIPs on PC boards by simply cutting off any excess on each lead after it has been inserted into the plated holes and soldered to the board.

What has thus been described is a thick film resistor network on an alumina substrate, the resistors being terminated by conducting metal leads. The resistor network, substrate and a small portion of each lead is encapsulated in a material with high insulation characteristics. The geometry of the leads and overall package alignment characterizes the device as a wire wrap SIP yielding a high board density and closer board-to-board spacing.

Obviously many modifications and variations of the present invention may become apparent in light of the above teachings. For example; wire wrap SIPs do not have to use thick film technology, but can be constructed using any technology that retains the desired functional and physical features. Further, the number of leads and the number and arrangement of elements within a network is not fixed, but depends upon the desired circuit application of the SIP. Parameters such as tolerances, wattage, temperature ranges, etc. are selected to conform to existing industry or governmental standards.

The wire wrap concept of the present invention can easily be extended to apply to individual passive elements such as capacitors, resistors, diodes, potentiometers and the like. While these elements can presently be wire wrap as stand-alone elements, their leads are round requiring that the precautionary measure of soldering all leads after wrapping must be employed. Making these leads square, sharp cornered wire wrap leads would make use of these stand-alone elements far easier, would not require headers, and would allow for closer proximity of stand-alone elements to the ICs they are associated with instead of having them located some distance away on a header. In conclusion, making the above mentioned SIPs and elements wire wrap type increases overall space savings; lowers the cost of assembled boards because the combined cost of headers and header sockets is more than that of just SIPs or stand-alone elements; allows for reuse of all wire wrap pieces; and greatly simplifies component location and wiring of the board.

In light of the above, it is therefore understood that within the scope of the appended claims the invention may be practiced otherwise than as specifically described.

What is claimed is:

1. An electronic apparatus adapted to be wire wrapped to a circuit board, comprising:

a rectangular ceramic block, having a width "w", height "h", depth "d", a longitudinal axis generally aligned with said width, a rectangular cavity formed therein aligned with said longitudinal axis and a plurality of uniformly spaced square apertures extending from the bottom surface thereof through said ceramic block and into said cavity, the axis of each said aperture being disposed orthogonally with respect to said longitudinal axis and aligned therewith, thereby forming a single aligned series of apertures;

a plurality of square, conducting, wire wrap leads, one each corresponding to each of said plurality of square apertures, each said lead extending a length "L" down from said bottom surface of said ceramic block and having a square cross section and sharp corners, said plurality of leads passing through and being fixedly attached to said square apertures of said ceramic block, for providing an electrically conducting path therethrough;

passive conduit means, generally disposed within said rectangular cavity and electrically connected to each said wire wrap lead, for providing a preselected passive circuit configuration when wire wrapped to said circuit board; and high impedance potting material, sealably filling said rectangular cavity, thereby surrounding and embedding said passive circuit means, for providing a single in-line package having wire wrap leads.

2. An apparatus to claim 1 wherein said ceramic block further comprises a ceramic pad formed integrally on each end thereof, for providing a stand-off clearance for the remainder of the bottom surfacef of said ceramic block above said circuit board while said ceramic pads are adhesively bonded thereto.

3. An apparatus according to claim 2 wherein said passive circuit means further comprises:

a plurality of thick film passive electrical elements, arranged in a preselected circuit configuration;

a first plurality of element leads, one each conductively connected to the corresponding said passive element, for providing a first plurality of desired circuit connections points;

a second plurality of element leads, one each conductively connected to the corresponding said passive element and to the corresponding said square lead, for providing a second plurality of desired circuit connection points;

an alumina substrate, conductively connected to said first plurality of element leads, and hence to said plurality of thick film passive elements; and at least one ground lead, conductively connected to said alumina substrate and to at least one said square lead, for providing a ground path for said passive element;

said plurality of elements, said alumina substrate, said at least one ground lead and said first and second plurality of element leads thereby forming said passive circuit means.

4. An apparatus according to claim 3 wherein said potting material is an epoxy.

* * * * *